(12) United States Patent
Lomazzi et al.

(10) Patent No.: US 6,208,705 B1
(45) Date of Patent: Mar. 27, 2001

(54) ELECTRONIC COUNTER FOR A NON-VOLATILE MEMORY DEVICE INTEGRATED ON A SEMICONDUCTOR

(75) Inventors: Guido Lomazzi, Castronno; Marco Maccarrone, Palestro; Stefano Ghezzi, Treviolo; Donato Ferrario, Carugate, all of (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 09/262,500

(22) Filed: Mar. 4, 1999

(30) Foreign Application Priority Data

Mar. 6, 1998 (IT) .............................................. MI98A0454

(51) Int. Cl.⁷ ........................................................ G06M 3/00
(52) U.S. Cl. ............................................... 377/26; 377/49

(58) Field of Search ........................................... 377/49, 26

(56) References Cited

U.S. PATENT DOCUMENTS 5,719,798 * 2/1998 Lutz et al. ............................ 364/703
5,787,135 * 7/1998 Clark .................................... 375/376

* cited by examiner

Primary Examiner—Margaret R. Wambach
(74) Attorney, Agent, or Firm—Theodore E. Galanthay; Robert Iannucci; Seed IP Law Group, PLLC

(57) ABSTRACT

An electronic counter for a semconductor-integrated non-volatile memory device includes a single count cell connected with its output to at least one storage element The count cell comprises a summing block of the half-adder type and a master portion of a master/slave flip-flop of which said storage element is a slave portion. Advantageously, the master portion has an output connected to the input side of a number n of slave registers arranged in parallel.

18 Claims, 4 Drawing Sheets

*Fig. 4B*                *Fig. 4C*

ELECTRONIC COUNTER FOR A NON-VOLATILE MEMORY DEVICE INTEGRATED ON A SEMICONDUCTOR

TECHNICAL FIELD

This invention relates to an electronic counter incorporated in electronic memory devices integrated on semincoductors.

BACKGROUND OF THE INVENTION

As is well known the procedures involved in programming, reading and erasing the contents of memory cells in a semiconductor-integrated electronic memory device are run as predetermined sequences of operations handled by suitable algorithms.

These algorithms are effective to time the several steps of such operations, but require the assistance of some counters to calculate the durations of various time intervals, the number of times that a given operation has been executed, or the value of an address bus.

The counters can take up a considerable amount of circuit area in the memory device. Also, the time taken to complete the various counts can affect the execution rate of the program and erase algorithms.

Thus, counters intended for use within a memory device normally require accurate specific designing.

As mentioned above, in executing an algorithm through the memory device, certain counts must be performed as detailed hereinbelow.

1) Counting the time intervals; this will serve to either set the duration of a signal pulse or establish wait intervals.
2) Counting the number of attempted executions of certain operations: this will serve to decide whether, following a predetermined number of iterations, any subsequent operation is to be carried out or an error signal is to be issued.
3) Calculating the value of a current address: this will serve to either repeat the same operation at all the memory locations or at a predetermined set of addressable locations in a particular algorithm.

It is readily evinced from the foregoing considerations the a proper execution of the algorithms involves counts of different nature, leading to different and values.

For instance, the program time is on the order of a few microseconds for the address of a memory location, whereas the erase time for the smallest addressable portion is on the order of one second. In addition, the number of program attempts may amount to a few tens, whereas the number of case attempts may be on the order of a few hundreds.

As for the addresses, it may be possible to program a full section of the memory array or the whole memory array, but in the erase mode, one or more sections may have to be erased, and each memory location verified in consequence; this means that all the addresses must be scanned.

The counting base of an electronic counter is binary, and the duration of the count is set by the period of its synchronization or "clock" signal.

For calculating the time intervals, the clock period must be known because the intervals are computed as multiples of that period.

For counts which are not based on time, only the counter range need to be defined.

Some examples are given hereinbelow.

The number of a memory location program attempts can be arranged to be at least fifteen, before an error signal is issued. In this case, a four-bit counter would be required, since the nearest binary value to fifteen is $2^4$.

If the memory device comprises a 1 Mbyte array, and the array is organized into bytes, then an address counter of no less than 20 bits must be available, for $2^{20}$=1,048.576.

If a program pulse duration can be 5 $\mu$s, while the erase pulse can have a duration of 10 ms, then 50 clock pulses would become necessary to span the first count and 100,000 clock pulses to span the second count, where am clock period is 100 ns. Accordingly, a six-bit ($2^6$=64) counter would be needed for the first count, and a seventeen-bit ($2^{17}$=131,072) counter for the second count.

It should be fiber considered that, in an electrically erasable non-volatile memory, the erasing of a section of the memory array may have to be discontinued in order to enable the programming of one or more locations in another section. In this not unlikely circumstance, the counts must be replicated because the counts for the erase operation need to be stopped and stored in order to effect the counts for the programming operation.

But even the programming may have to be discontinued, to allow a read operation from some other memory location.

Finally, there exists a pressing demand for electrically erasable non-volatile memory devices wherein the user can request reading from plural adjacent memory locations by only entering address of the first location (in the so-called "burst model" access). In this case, the device should be capable of calculating the next addresses from the entered one.

To summarize, a memory device of the type described hereinabove may require as many as seven different counters, namely:
  a program time counter;
  an erase time counter;
  a program attempt counter;
  an erase attempt counter;
  a program address counter;
  an erase address counter; and
  a burst mode address counter.

A known solution which has been used in the past provided all of these seven counters within a memory device. An obvious advantage of this solution is that all the counts to be performed are available in an independent manner. However, a significant disadvantage comes from the concurrent use of a large circuit area.

A more recent solution provides for the use of but one counter interfaced with a plurality of latch registers.

To activate or deactivate the counting, the counter is delivered an enable signal ENABLE from the memory internal logic circuitry. The enable signal increases by "1" the contents of the first count cell on the leading edge of the clock signal.

The counter has several outputs which supply the current count value at each time.

To effect the various counts at the appropriate times, the contents of a first latch is replicated into the counter, and the result of the count is replicated into a second latch.

The accompanying FIG. 1 shows schematically a convention single counter for memory devices. The counter includes a count cell which consists of a half-adder type of summing block having a flip-flop cascade connected thereto.

The half-adder cell has a first count output connected to the flip-flop and a second, carry-over output CARRYOUT liked directly to an output of the couter.

The flip-flop output is input to both a first flip-flop and a second flip-flop outside the counter. The parallel-connected flip-flops may be provided in any desired number. The individual outputs of both these external flip-flops are connected to an input of he half-adder cell.

The counter construction is completed by a second, carry-over input CARRYIN which represents an enable signal to the first cell and the signal CARRYOUT to the next cell.

As an example, suppose that the times and the erase attempts are to be counted. During a first period of the clock pulse, the contents of the count cell will be replicated into the first external flip-flop storing the number of attempts, whereas during a second period of the clock pulse, the contents of the second external flip-flop will be replicated into the count cell. The count proper requires one or more clock periods.

Should it become necessary to start a count of the attempts at this stage, two additional clock pulses would be needed before the count can be started.

In essence, a loss in performance is traded for a reduced occupation of circuit area, due to the longer time taken to execute the various algorithm.

Modem memory devices involve a fairly large number of counts, and this reflects in increased complexity of the control logic.

SUMMARY OF THE INVENTION

An embodiment of this invention provides a single electronic counter for an electrically erasable non-volatile memory device integrated on a semiconductor, which counter has suitable functional and constructional features to shorten the execution times for the various programming and erasing algorithms, allows of operation in the burst mode, and is low in circuit area requirement. This effectively overcomes the drawbacks with which the prior art approaches are still beset.

The counter has a single count cell associated with a single master portion shared by a plurality of slave registers.

The cell comprises a summing block and just the master portion of said memory device.

The features and advantages of a counter according to the invention will be apparent from the following description of an embodiment thereof, given by way of non-limitative example with reference to the accompanying drawings.

BRIEF DESCRIPTION OF THE DRAWINGS

FIGS. 4A, 4B, 4C and 4D are further views showing schematically respective details of the counter of FIG. 2.

DETAILED DESCRIPTION

Figure 1:
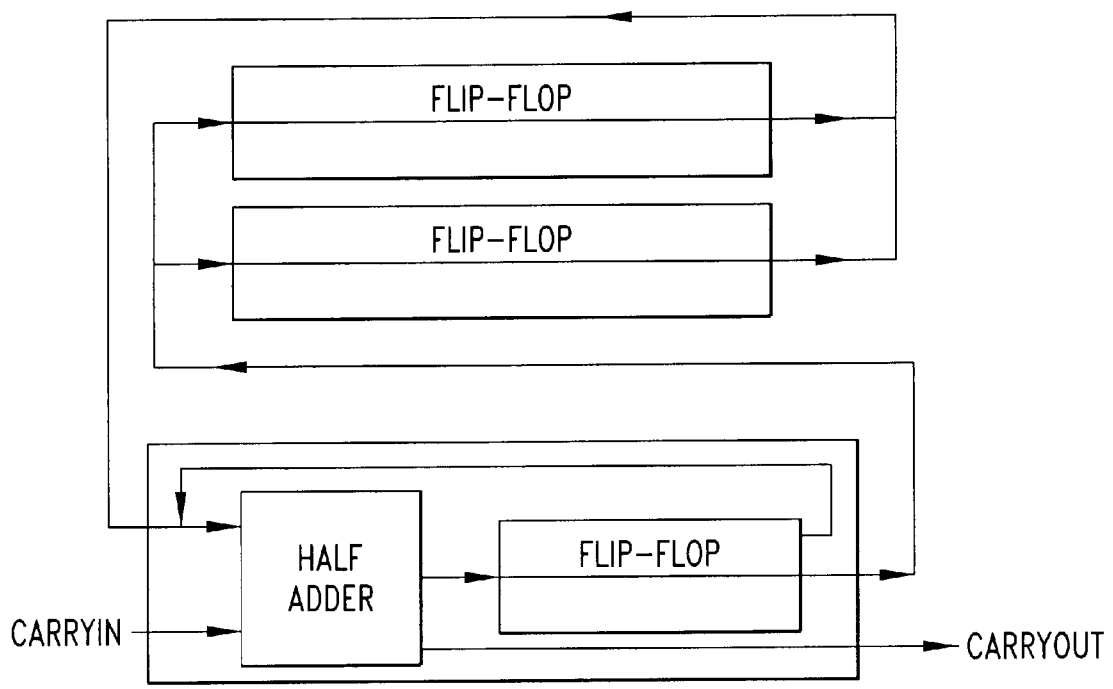
FIG. 1 shows schematically a counter according to the prior art.
Figure 2:
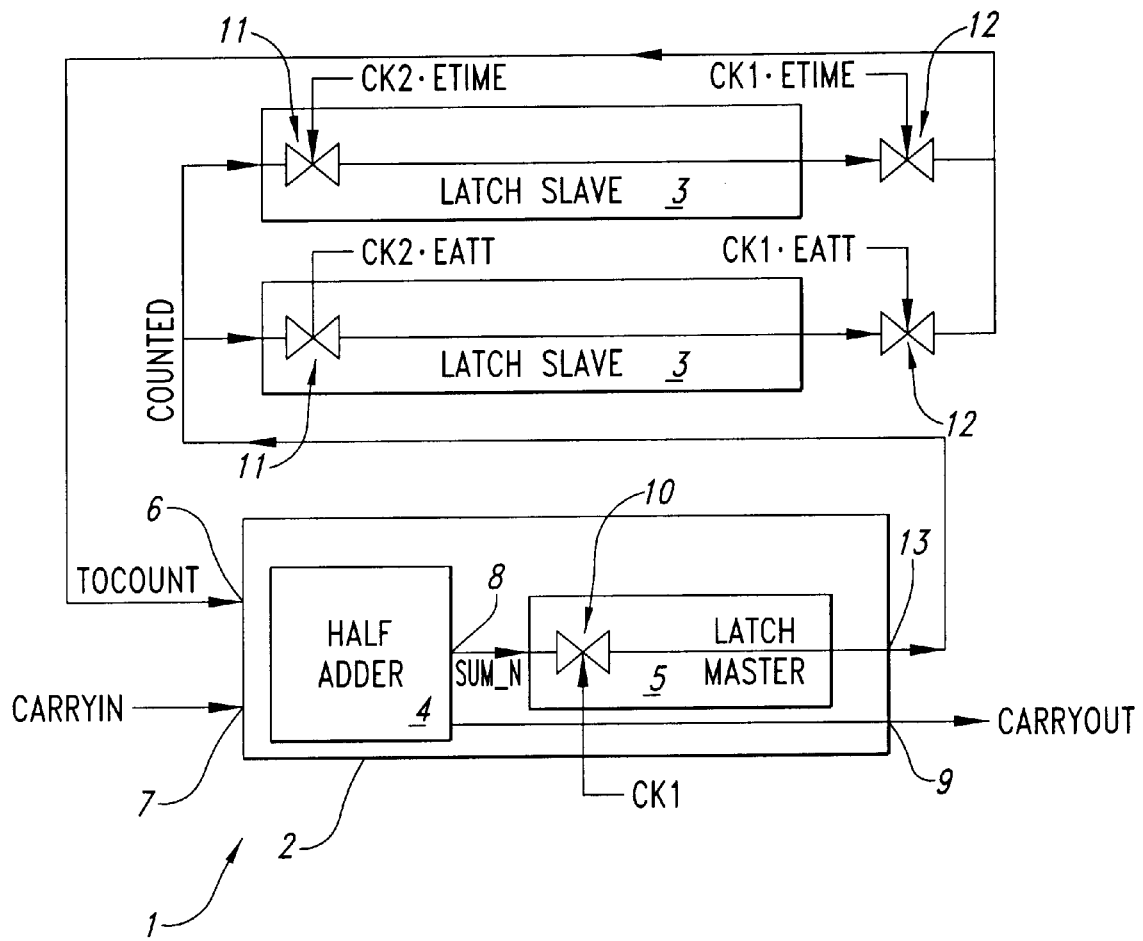
FIG. 2 shows schematically a counter according to an embodiment of this invention.

Referring to the drawing views, specifically to the example of FIG. 2, shown generally and schematically is an electronic counter 1 intended for incorporation into semiconductor-integrated electronic devices which include memory cells.

The term "memory cells" means here a plurality of storage elements as incorporated in a conventional semiconductor-integrated electronic device which is constructed as a matrix of cells organized into rows and columns. Correspondingly associated with the matrix are row and column decoding circuit portions and sense amplifiers.

The memory cells may be any types; however, for the purpose of this invention, non-volatile Flash EEPROM cells adapted to be programmed and erased electrically are preferred.

The electronic circuit 1 is a one-bit binary counter.

The counter 1 comprises a count cell 2 and a plurality of registers 3 (LATCH SLAVE).

In the exemplary embodiment depicted in FIG. 2, there are first and second registers 3 provided, but the circuit 1 could be implemented with a larger number n of registers 3.

Specifically, the number n of registers 3 is established by the number of different counts to be performed.

The count cell 2 comprises a summing block 4 of the half-adder type and a master portion 5 of a master/slave flip-flop.

The summing block 4 has first 6 and second 7 inputs which correspond to the two inputs of the cell 2 arranged to receive signals TOCOUNT and CARRYIN, respectively. The block 4 has a first count output 8 for outputting a signal SUM_N. This output 8 is connected to the input side of the master portion 5 via a controlled switch 10.

The switch 10 may be implemented, for example, as a pass gate or pass transistor driven by a clock signal CK1. Alternatively, a controlled switch of any other type could be used.

A second output 9 of the block 4 is carried to the output of the cell 2 for outputting a carry-over signal CARRYOUT.

Each of the registers 3 is essentially a slave portion of a master/slave flip-flop. Their corresponding master portions are represented by the portion 5 incorporated to the count cell 2.

Thus, the count cell 2 represents an incomplete counter, and to form a complete counter, the cell 2 should be connected to at least one of the registers 3.

In particular, said master portion 5 has an output 13 connected to the input side of a number n of slave registers 3 arranged in parallel. A controlled switch 11 is associated with the input of each slave register 3.

This switch 11 may be a pass gate driven by a clock signal CK2.

Each slave register 3 also has a controlled switch 12 associated with its output. This switch 12 may be a pass gate driven by the clock signal CK1.

The outputs of the registers 3 are individually connected to the input 6 of the count cell 2 by their respective controlled switches 12.

In the embodiment described herein by way of non-limitative example, the first register 3 is dedicated to counting the erase attempts; and has its input switch 11 enabled by the logic product (AND) of a logic signal EATT (Erase Attempts) with the second clock signal CK2 while its output switch 12 is enabled by the logic product (AND) of the logic signal EATT with the first clock signal CK1.

The second register 3 is dedicated to counting the erase time, and has its input switch 11 enabled by the logic product (AND) of a logic signal ETIME (Erase ing) with the second clock signal CK2 while its output switch 12 is enabled by the logic product (AND) of the logic signal EATT with the first clock signal CK1.

Figure 3A:
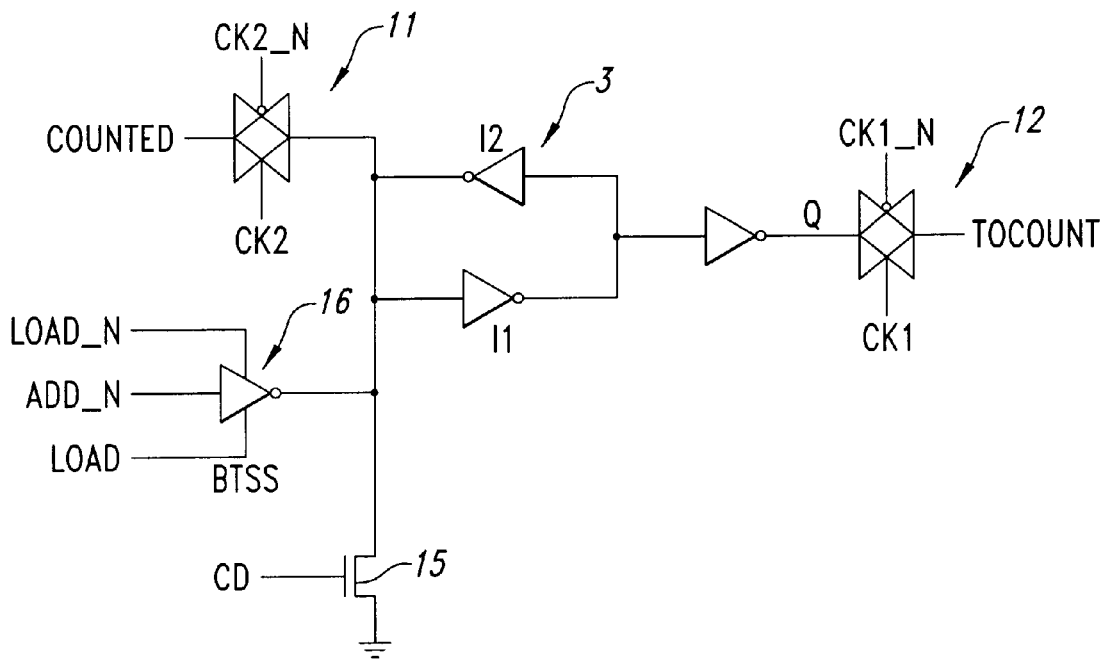
FIGS. 3A, 3B and 3C are respective views showing schematically details of the counter of FIG. 2.
Figure 3B:
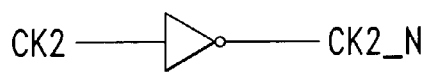
Figure 3C:
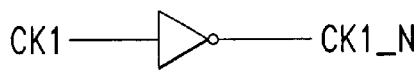

The accompanying FIGS. 3A, 3B and 3C illustrated the circuit construction of a latch register 3 and its associated controlled switches 11 and 12. FIGS. 3B and 3C just show respective inverters which are used to negate the clock signals CK1 and CK2.

The register 3 includes a pair of inverters I1, I2 which are connected together in feed-forward relationship. The register 3 will retain its informational contents, in the shut-off condition of the it pass gate 11, by reason of the conductivity of the first inverter I1 being higher than that of the second inverter I2.

A reset transistor 15 is optionally arranged to connect the latch to ground upon a signal CD being received. In addition, a tristate 16 is provided for load into the register 3 asynchronously. Not even the last-mentioned component is strictly necessary.

Figure 4A:
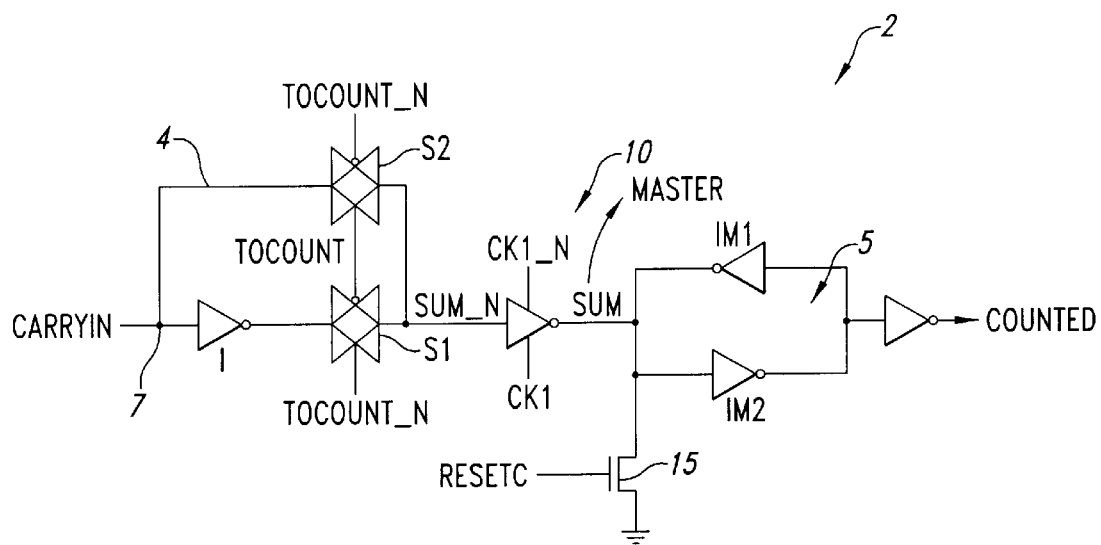
Figure 4D:
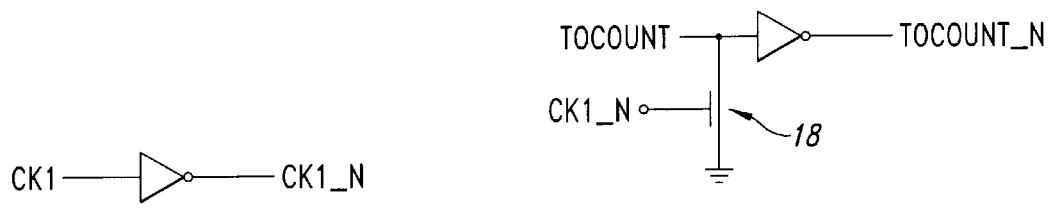
Figure 4D:

Shown in FIGS. 4A, 4B and 4C we the circuit constructions of the count cell 2 and the master portion 5 associated therewith FIGS. 4B, 4C and 4D merely show respective inverters and logic gate chains, as used to negate the signals CK1 and TOCOUNT and to define the carry-over signal CARRYOUT.

The cell 2 includes the half-adder 4 and a pair of inverters IM1, IM2 which are connected together in feed-forward relationship to form the master latch 5. The summing block 4 includes an inverter I and first S1 and second S2 switches, the first inverter I being coupled between the second input 7 and an input of the first switch S1.

The constuction of the portion 5 corresponds basically to that of a slave latch register 3.

The half-adder block 4 is uniquely small and fast; however, it would be equally possible to use any other type of half-adder.

The operation of the electronic counter 1 will now be described.

While no counts are being effected, all the input and output switches, 11 and 12, of the registers 3 are open. The registers 3 will then retain their informational contents on a permanent basis.

In this situation, the output 13 from the master portion 5 has no effect on the contents of the registers 3.

The outputs from the counter 1 correspond to the outputs from the registers 3.

The signal TOCOUNT is set to a logic low by a transistor 18, a signal SUM_N is the negated value of the input signal CARRYIN, and CARRYOUT is set to a logic low by the signal TOCOUNT. With the signal CK1 in a logic low state, the input switch 10 of the master portion 5 is open, and a signal COUNTED will retain its latest acquired value.

Assume now that the signal EATT is activated and the sign CARRYIN is a "1"; in this case, the one-bit counter would be oscillating logically.

Upon the leading edge of the signal CK1, the output switch 12 of the first register 3 is closed and the signal TOCOUNT takes a corresponding logic value to the contents of the first register 3.

Assume that TOCOUNT presently goes to a logic value of "0". The half-adder block 4 has its two outputs defined by the following operations:

CARRYOUT=CARRYIN·TOCOUNT

SUM=CARRYIN⊕TOCOUNT.

Based on the previous assurption, it will be SUM=1 and CARRYOUT=0.

Since CK1=1, the signal SLM is stored into the master portion 5. Upon the signal CK1 dropping to 0 while the signal CK2 is on the rise, the value SUM is transferred into the first of the registers 3.

A subsequent clock pulse of CK1 causes the input signal TOCOUNT of the count cell 2 to take the contents of the register 3 which had been enabled, that is the value "1".

At this point, it is SUM=0 and CARRYOUT=1. Therefore, the one-bit will be oscillating because TOCOUNT=1 and SUM=0, and so forth.

On the contrary, if CARRYIN=0, the circuit will not be oscillating, since TOCOUNT=0 and SUM=0, and TOCOUNT will retain its 0 value upon the next clock pulse.

If TOCOUNT=1, then SUM=1, and accordingly, TOCOUNT again retains its value.

When any given type of count is to be terminated, it suffices that the selection signal, active up to that time, be set to "0" and another signal activated. In this instance, it is EATT=0 and ETIME=1. Upon the next clock pulse CK1, the count is resumed as previously described, except that it is started from the second slave register 3.

Thus, there exist no additional clock periods to the counting period.

CARRYOUT for the n-th bit corresponds to CARRYIN for the (n+1)-th bit, which means that each bit will be oscillaing at twice the frequency of the following bit and at one half the frequency of the preceding bit. This only holds logic-wise, however, because in integrated storage circuits, counters are physically very long and the parasitic capacitive load on the transmission lines are significant and specific circuit structures must be provided to speed up the propagation of the carry-over signal.

The counter 1 does solve the technical problems of the prior art discussed above and affords a number of advantages, foremost among which is the fact that a single counter can provide all types of counts without retarding the execution of the various memory handling algorithms. In particular, the communication times between the counter and the registers storing the executed counts are now instantaneous and do not burden the algorithms execution times.

Furthermore, less circuit area is occupied than in prior solutions, by virtue of the count cell 2 having a single master portion which is shared by a plurality of slave registers.

Thus, the counter of this invention has reduced circuit area requirements for no penalties in terms of algorithm execution time.

An additional advantage comes from that the peculiarly modular arrangement of the slave registers connected to the count cell allows any counter types to be readily tailored modularly to the use's requirements.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An electronic counter for a semiconductor-integrated non-volatile memory device, comprising a single count cell having an output connected to at least one flip-flop storage element, wherein said count cell comprises a summing block and a single master portion that forms a master/slave flip-flop with said storage element, wherein said master portion is connected to an output of the summing block via a controlled switch.

2. A counter according to claim 1, wherein said summing block is a half-adder.

3. A counter according to claim 1, wherein said controlled switch is a pass gate driven by a clock signal.

4. A counter according to claim 1, wherein said master portion has an output connected to an input side of each of a number n of slave registers arranged in parallel and each having an output connected to an input side of the count cell, wherein said storage element is one of said slave registers.

5. An electronic counter for a semiconductor-integrated non-volatile memory device, comprising a single count cell having an output connected to at least one flip-flop storage element, wherein said count cell comprises a summing block and a single master portion that forms a master/slave flip-flop with said storage element, wherein said master portion has an output connected to an input side of each of a plurality of slave registers arranged in parallel and each having an output connected to an input side of the count cell, wherein said storage element is one of said slave registers, and wherein each of the slave registers includes a controlled switch connecting the slave register to the output of the master portion.

6. A counter according to claim 5, wherein said controlled switch is a pass gate driven by a signal that is the logic product of a clock signal and an enable signal.

7. An electronic counter for a semiconductor-integrated non-volatile memory device, comprising a single count cell having an output connected to at least one flip-flop storage element, wherein said count cell comprises a summing block and a single master portion that forms a master/slave flip-flop with said storage element, wherein said master portion has an output connected to an input side of each of a plurality of slave registers arranged in parallel and each having an output connected to an input side of the count cell, wherein said storage element is one of said slave registers, and further including a plurality of controlled switches respectively connecting the outputs of the slave registers to the input side of the count cell.

8. A counter according to claim 7, wherein each of said controlled switches is a pass gate driven by a signal that is the logic product of a clock signal and an enable signal.

9. A counter, comprising:
a count cell that includes a summing circuit and a master portion of a master/slave flip-flop, the summing circuit being structured to sum first and second inputs to obtain a summed result that is stored in the master portion, the master portion including an input coupled to the summing circuit and an output; and
a first slave portion of the master/slave flip-flop, the slave portion including an input coupled to the output of the master portion and an output coupled to the first input of the summing circuit, wherein the summing circuit includes a first inverter and first and second switches, the first inverter being coupled between the second input of the summing circuit and an input of the first switch, the first switch also including an output coupled to an output of the summing circuit, the second switch having an input coupled to the second input of the summing circuit and an output coupled to the output of the summing circuit, and each of the first and second switches including a control terminal coupled to the first input of the summing circuit.

10. The counter of claim 9 wherein the count cell further includes a second inverter coupled between the output of the summing circuit and the input of the master portion.

11. The counter of claim 9, further comprising a second slave portion coupled in parallel with the first slave portion between the output of the master portion and the input of the summing circuit.

12. The counter of claim 9 wherein the summing circuit includes first and second outputs, the first output of the summing circuit being coupled to the input of the master portion and the second output of the summing circuit being an output of the counter.

13. A counter, comprising:
a count cell that includes a summing circuit and a master portion of a master/slave flip-flop, the summing circuit being structured to sum first and second inputs to obtain a summed result that is stored in the master portion, the master portion including an input coupled to the summing circuit and an output;
a first slave portion of the master/slave flip-flop, the slave portion including an input coupled to the output of the master portion and an output coupled to the first input of the summing circuit;
a second slave portion coupled in parallel with the first slave portion between the output of the master portion and the input of the summing circuit;
a first input switch coupling the output of the master portion to the input of the first slave portion, the first input switch being responsive to a first enable signal; and
a second input switch coupling the output of the master portion to an input of the second slave portion, the second input switch being responsive to a second enable signal.

14. A counter, comprising:
a count cell that includes a summing circuit and a master portion of a master/slave flip-flop, the summing circuit being structured to sum first and second inputs to obtain a summed result that is stored in the master portion, the master portion including an input coupled to the summing circuit and an output;
a first slave portion of the master/slave flip-flop, the slave portion including an input coupled to the output of the master portion and an output coupled to the first input of the summing circuit;
a second slave portion coupled in parallel with the first slave portion between the output of the master portion and the input of the summing circuit;
a first output switch coupling the output of the first slave portion to the first input of the summing circuit, the first output switch being responsive to a first enable signal; and
a second output switch coupling an output of the second slave portion to the first input of the summing circuit, the second output switch being responsive to a second enable signal.

15. A counter, comprising:
a count cell that includes a summing circuit and a master portion of a master/slave flip-flop, the summing circuit being structured to sum first and second inputs to obtain a summed result that is stored in the master portion, the master portion including an input coupled to the summing circuit and an output; and
a first slave portion of the master/slave flip-flop, the slave portion including an input coupled to the output of the master portion and an output coupled to the first input of the summing circuit; wherein the count cell further includes a first switch coupled between the output of the summing circuit and the input of the master portion and the counter further includes a second switch coupling the output of the first slave portion to the first input of the summing circuit, the first and second switches each being responsive to a same clock signal.

16. A method of providing plural count values, comprising:
summing first and second input values in a count cell to obtain a summed result;
storing the summed result in the count cell upon receiving a transition of a first clock signal;
receiving from the count cell the summed result in a first register in response to a first enable signal becoming active;

transmitting the summed result from the first register to the count cell as a next input value upon a next transition of the first clock signal if the first enable signal continues to be active; and transmitting a next input value from a second register to the count cell upon the next transition of the first clock signal if a second enable signal associated with the second register is active.

17. The method of claim 16 wherein the summing step is an exclusive-OR logic option.

18. The method of claim 16 wherein the step of receiving the summed result in the first register is responsive to a signal that is the logical product of the first enable signal and a second clock signal.

* * * * *